(12) United States Patent
Yasuda et al.

(10) Patent No.: US 8,735,264 B2
(45) Date of Patent: May 27, 2014

(54) TEMPORARY ADHESIVE COMPOSITION AND METHOD FOR MANUFACTURING THIN WAFER USING THE SAME

(71) Applicant: Shin-Etsu Chemical Co., Ltd., Tokyo (JP)

(72) Inventors: Hiroyuki Yasuda, Annaka (JP); Masahiro Furuya, Annaka (JP); Michihiro Sugo, Annaka (JP); Shohei Tagami, Annaka (JP); Hideyoshi Yanagisawa, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/628,678

(22) Filed: Sep. 27, 2012

(65) Prior Publication Data
US 2013/0089967 A1    Apr. 11, 2013

(30) Foreign Application Priority Data

Oct. 7, 2011 (JP) .................................. 2011-223233

(51) Int. Cl.
*C09J 183/04* (2006.01)
*H01L 21/762* (2006.01)
*C08K 5/01* (2006.01)
*C08K 5/105* (2006.01)
*C08K 5/101* (2006.01)
*C08K 5/37* (2006.01)

(52) U.S. Cl.
USPC ........... 438/458; 524/588; 524/291; 524/331; 257/E21.568

(58) Field of Classification Search
None
See application file for complete search history.

(56) References Cited

U.S. PATENT DOCUMENTS

| | | | | |
|---|---|---|---|---|
| 6,815,076 B2 * | 11/2004 | Aoki | .............................. | 428/448 |
| 6,907,176 B2 * | 6/2005 | Gardner et al. | ............... | 385/129 |
| 7,323,250 B2 * | 1/2008 | Tabei et al. | ................... | 428/447 |
| 7,541,264 B2 | 6/2009 | Gardner et al. | | |
| 7,799,433 B2 * | 9/2010 | Nakamura et al. | ............ | 428/447 |
| 7,951,891 B2 * | 5/2011 | Miyoshi et al. | .................. | 528/12 |
| 8,206,831 B2 * | 6/2012 | Aoki | .............................. | 428/447 |
| 2002/0173614 A1 * | 11/2002 | Robbins | .......................... | 528/10 |
| 2007/0025678 A1 * | 2/2007 | Kushibiki et al. | ............. | 385/141 |
| 2007/0135590 A1 * | 6/2007 | Kotani et al. | .................. | 525/479 |
| 2008/0207848 A1 * | 8/2008 | Morita et al. | .................. | 525/475 |
| 2009/0038750 A1 * | 2/2009 | Hong et al. | .................... | 156/247 |
| 2011/0136321 A1 * | 6/2011 | Kuroda et al. | ................. | 438/459 |
| 2011/0297300 A1 * | 12/2011 | Furuya | ........................... | 156/154 |

FOREIGN PATENT DOCUMENTS

| | | |
|---|---|---|
| EP | 2 492 332 A1 | 8/2012 |
| JP | A-2004-64040 | 2/2004 |
| JP | A-2006-328104 | 12/2006 |
| WO | WO 2004/006296 A2 | 1/2004 |
| WO | WO 2006/038638 A1 | 4/2006 |

OTHER PUBLICATIONS

Extended Search Report issued in European Patent Application No. 12006849.9 dated Feb. 28, 2013.

* cited by examiner

*Primary Examiner* — Robert S Loewe
(74) *Attorney, Agent, or Firm* — Oliff PLC

(57) ABSTRACT

The present invention is a temporary adhesive composition comprising: (A) non-aromatic saturated hydrocarbon group-containing organopolysiloxane; (B) an antioxidant; and (C) an organic solvent, wherein the component (A) corresponds to 100 parts by mass, the component (B) corresponds to 0.5 to 5 parts by mass, and the component (C) corresponds to 10 to 1000 parts by mass. There can be provided a temporary adhesive composition that has excellent thermal stability while maintaining solvent resistance and a method for manufacturing a thin wafer using this.

10 Claims, No Drawings

TEMPORARY ADHESIVE COMPOSITION AND METHOD FOR MANUFACTURING THIN WAFER USING THE SAME

BACKGROUND OF THE INVENTION

1. Field of the Invention

The present invention relates to a temporary adhesive composition and a method for manufacturing a thin wafer using this.

2. Description of the Related Art

Three-dimensional semiconductor packaging has been required for realizing further high integration and capacity enlargement. Three-dimensional semiconductor packaging technology means semiconductor fabrication technology for reducing a thickness of one semiconductor chip and laminating many layers while achieving wire connection by using through-silicon vias (TSVs). To realize this technology, there is required an electrode forming step of reducing a thickness of a substrate having a semiconductor circuit formed thereon by backgrinding and forming electrodes and others including TSVs on a back side. At a conventional backgrinding step for a silicon substrate before the electrode forming step, a protection tape is applied to the opposite side of a surface to be ground, and wafer damage in grinding is avoided. However, since this tape uses an organic resin film as a base material, it has flexibility but, on the other hand, it has insufficient strength or heat resistance, and hence it is not suitable when carrying out a wiring layer forming process on a back side.

Therefore, there has been suggested a system that can sufficiently cope with the backgrinding step or the back side electrode forming step by bonding a semiconductor substrate to a support substrate made of, e.g., silicon or glass through an adhesive. At this time, the adhesive when bonding both the substrates is important. This adhesive requires adhesiveness that enables boding the substrates without gaps and sufficient durability that enables coping with subsequent processes. Further, it is important to enable readily delaminating a thin wafer from the support substrate. As described above, since delamination is performed at the end, this adhesive will be referred to as a temporary adhesive.

As a known temporary adhesive and its delamination method, there have been suggested technology for irradiating an adhesive containing a light-absorptive material with light having high intensity, decomposing an adhesive layer, and thereby delaminating the adhesive layer from a support substrate (Patent Document 1) and technology for using a hydrocarbon based hot-melt compound as an adhesive and performing bonding/delamination in a heated and molten state (Patent Document 2). However, the former requires an expensive apparatus such as a laser, and it has a problem that a processing time per substrate is prolonged, for example. Furthermore, the latter is convenient since control is effected by heating alone, but thermal stability is insufficient at a high temperature exceeding 200° C., and a process application range is narrow.

Patent Document 1: Japanese Unexamined Patent Application Publication No. 2004-064040
Patent Document 2: Japanese Unexamined Patent Application Publication No. 2006-328104
Patent Document 3: U.S. Patent No. 7541264

SUMMARY OF THE INVENTION

Moreover, to realize the three-dimensional semiconductor packaging technology, technology using a silicone adhesive as a temporary adhesive layer has been suggested (Patent Document 3). According to this technology, substrates are bonded by using an addition-cure type silicone adhesive, and both the substrates are immersed in a chemical that resolves or decomposes a silicone resin at the time of delamination and the substrates are separated from each other. Therefore, a very long time is required for delamination, and applying the technology to an actual manufacturing process is difficult.

On the other hand, since such a temporary adhesive is no longer required after the delamination, a remaining adhesive layer must be cleaned off or removed by an organic solvent, the temporary adhesive must be easily dissolved in a cleaning organic solvent (a nonpolar solvent). However, the temporary adhesive must be poorly dissolved in the organic solvent (a polar solvent) used when applying or removing a photoresist to a semiconductor side of a joined substrate. Controlling the solubility for such an organic solvent is a very important characteristic in this intended purpose.

Materials mainly containing organic groups used for conventional organopolysiloxane, i.e., a methyl group or a phenyl group often have high solubility with respect to a polar solvent such as acetone and N-methylpyrrolidone, and they must be improved for the above-described intended purpose.

On the other hand, when a non-aromatic saturated hydrocarbon group is introduced into organopolysiloxane, solvent resistance with respect to the polar solvent can be improved, but an outgas is generated from decomposition of the hydrocarbon group during heating at a high temperature (e.g., 270° C.), voids are also generated, and thermal stability is insufficient.

To solve the above-described problems, it is an object of the present invention to provide a temporary adhesive composition that maintains solvent resistance with respect to a polar solvent and has excellent thermal stability and a method for manufacturing a thin wafer using this.

To achieve the object, according to the present invention, there is provided a temporary adhesive composition comprising:

(A) non-aromatic saturated hydrocarbon group-containing organopolysiloxane;
(B) an antioxidant; and
(C) an organic solvent, wherein the component (A) corresponds to 100 parts by mass, the component (B) corresponds to 0.5 to 5 parts by mass, and the component (C) corresponds to 10 to 1000 parts by mass.

Such a temporary adhesive composition is superior in heat resistance (thermal stability) and soluble in a nonpolar organic solvent for cleaning but, on the other hand, it is poorly soluble in a polar organic solvent that is used when applying a photoresist to a semiconductor side of a joined substrate or removing the photoresist.

Further, the antioxidant of the component (B) is preferably at least one or more types of compositions selected from a group including a hindered phenol based compound, a hindered amine based compound, an organic phosphorous compound, and an organic sulfur compound.

When such a compound is used as the antioxidant, the heat resistance can be further improved.

Furthermore, the non-aromatic saturated hydrocarbon group-containing organopolysiloxane of the component (A) is preferably organopolysiloxane (A-1) that has a weight average molecular weight of 2,000 to 60,000, is insoluble in a polar solvent having an SP value higher than 9, and contains units represented by the following (1) to (III) or organopol ysiloxane (A-2) obtained by increasing a molecular weight using the organopolysiloxane (A-1) as a starting material:

(I) a siloxane unit represented by $R^1SiO_{3/2}$ (a T unit): 50 to 99 mole %;
(II) a siloxane unit represented by $R^2R^3SiO_{2/2}$ (a D unit): 0 to 49 mole %; and
(III) a siloxane unit represented by $R^4{}_3SiO_{1/2}$ (an M unit): 1 to 15 mole %, wherein each of $R^1$ to $R^4$ represents a monovalent organic group, 50 to 80 mole % in all organic groups represented by $R^1$ to $R^3$ represent the same or different non-aromatic saturated hydrocarbon groups including one of the following cyclic structures, and 10 to 40 mole % are the same or different substituted or unsubstituted monovalent acyclic saturated hydrocarbon groups each having a carbon number of 6 to 15, and further, groups other than the cyclic or acyclic saturated hydrocarbon groups in all organic groups represented by $R^1$ to $R^4$ represent the same or different substituted or unsubstituted monovalent hydrocarbon groups each having a carbon number of 1 to 7.

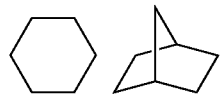

If the component (A) is organopolysiloxane mentioned above, the temporary adhesive composition particularly superior in solubility control can be provided.

Moreover, the organopolysiloxane (A-2) is preferably organopolysiloxane that is obtained by effecting a hydrosilylation reaction in the presence of a platinum group metal catalyst with respect to alkenyl group-containing organopolysiloxane (a1) that 2 to 10 mole % in all organic groups represented by $R^1$ to $R^4$ in the organopolysiloxane (A-1) represent alkenyl groups having a carbon number of 2 to 7 and one or more types of organohydrogenpolysiloxane (a2) that are represented by the following general formula (1) and has total SiH groups whose amount is 0.4 to 1.0-fold of total alkenyl groups in the alkenyl group containing organopolysiloxane (a1), the organopolysiloxane having a weight average molecular weight of 30,000 to 200,000 and being insoluble in a polar solvent that has an SP value higher than 9,

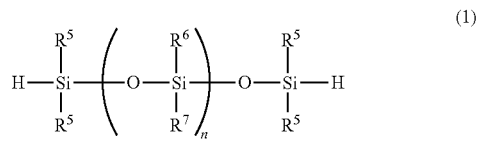

(1)

wherein $R^5$ to $R^7$ represent the same or different monovalent hydrocarbon groups each having a carbon number of 1 to 12 excluding an alkenyl group, and n represents an integer of 0 to 100.

If (A-2) is organopolysiloxane obtained by realizing a high molecular weight of the organopolysiloxane (A-1), the temporary adhesive composition that is further superior in the adhesiveness and the heat resistance can be provided.

Additionally, the organic solvent of the component (C) is preferably a hydrocarbon solvent that has a boiling point of 120 to 240° C. and an SP value which is 9 or lower.

Such an organic solvent has high safety since its flash point is high, readily volatilizes in drying by heating after applying the organic solvent, and is hard to stay in the film, and hence formation of air bubbles on a bonding surface can be suppressed even when the temporary adhesive composition is exposed to a high temperature in a heating process after bonding the substrates.

Further, according to the present invention, there is provided a method for manufacturing a thin wafer by bonding a wafer having a circuit forming surface and a circuit non-forming surface to a support substrate and performing grinding, comprising:

a bonding step of forming an adhesion layer on at least one of the circuit forming surface and the support substrate surface by using the temporary adhesive composition according to the present invention, and bonding the circuit forming surface of the wafer to the support substrate through the adhesion layer;

a grinding step of grinding the circuit non-forming surface of the wafer bonded to the support substrate;

a delaminating step of delaminating the ground wafer from the support substrate; and a removing step of removing the adhesion layer remaining on the circuit forming surface of the delaminated wafer.

According to such a method for manufacturing a thin wafer, the wafer can be delaminated from the support substrate in a short time at the delaminating/removing steps, the wafer is not delaminated from the support substrate even if the photoresist is applied to or removed from the semiconductor side of the joined substrate during the thin wafer manufacturing process, and hence the thin wafer can be highly efficiently produced.

As described above, the temporary adhesive composition according to the present invention is superior in the heat resistance, soluble in a nonpolar organic solvent, and can be delaminated from the support substrate in a short time. Furthermore, on the other hand, it is possible to provide the temporary adhesive composition that is poorly soluble in a polar organic solvent used when applying or removing the photoresist to or from the semiconductor side of the joined substrate, has excellent adhesiveness when manufactured as the temporary adhesive, and is not delaminated when applying or removing the photoresist to or from the semiconductor side of the joined substrate.

Moreover, according to the method for manufacturing a thin wafer using the temporary adhesive composition of the present invention, the thin wafer can be highly efficiently produced.

DETAILED DESCRIPTION OF THE REFERRED EMBODIMENTS

The present invention will now be described hereinafter in more detail.

As described above, development of a temporary adhesive that is optimum for realizing mainly the three-dimensional semiconductor packaging technology and superior in the thermal stability while maintaining the solvent resistance has been demanded.

As a result of repeatedly keenly conducting examination for achieving the object, the present inventors discovered that a temporary adhesive composition having a later-described composition is poorly soluble in a polar organic solvent used when applying or removing a photoresist to or from a semiconductor side of a joined substrate and has the excellent heat resistance (thermal stability) while maintaining the solvent resistance that the composition is soluble in a nonpolar organic solvent, and the inventors brought the present invention to completion.

Although the temporary adhesive composition according to the present invention and a method for manufacturing a thin wafer using this will now be described hereinafter in detail, but the present invention is not restricted thereto.

<Temporary Bond Composition>

The temporary adhesive composition according to the present invention contains:

(A) non-aromatic saturated hydrocarbon group-containing organopolysiloxane;
(B) an antioxidant; and
(C) an organic solvent, wherein the component (A) corresponds to 100 parts by mass, the component (B) corresponds to 0.5 to 5 parts by mass, and the component (C) corresponds to 10 to 1000 parts by mass.

In particular, by containing (A) non-aromatic saturated hydrocarbon group-containing organopolysiloxane and (B) the antioxidant, the excellent heat resistance and solvent resistance are exerted.

[Component (A)]

The component (A) according to the present invention is non-aromatic saturated hydrocarbon group-containing organopolysiloxane, and one type of organopolysiloxane contained in the temporary adhesive composition alone may be used, two or more types of the same may be used. As preferably used components, there are roughly the following two components (A-1) and (A-2). They will be sequentially described hereinafter.

The organopolysiloxane (A-1) is non-aromatic saturated hydrocarbon group-containing organopolysiloxane that has a weight average molecular weight (Mw) [a corresponding value of polystyrene based on GPC (gel permeation chromatography)] of 2,000 to 60,000, is insoluble in a polar solvent having an SP value [a solubility parameter $(cal/cm^3)^{1/2}$] higher than 9, and contains units represented by the following (I) to (III):

(I) a siloxane unit (a T unit) represented by $R^1SiO_{3/2}$: 50 to 99 mole %;
(II) a siloxane unit (a D unit) represented by $R^2R^3SiO_{2/2}$ (D unit) : 0 to 49 mole %; and
(III) a siloxane unit (an M unit) represented by $R^4{}_3SiO_{1/2}$ Each of $R^1$ to $R^4$ in the units represented by (I) to (III) is a monovalent organic group.

In particular, to develop a difference in solubility, the content of the non-aromatic saturated hydrocarbon group having a cyclic structure (a non-aromatic cyclic saturated hydrocarbon group) is important, and the content of the non-aromatic cyclic saturated hydrocarbon group in $R_1$ to $R^3$ is preferably 50 to 80 mole %. If the content is 50 mole % or more, it is easy to provide poor solubility in a polar organic solvent used when applying or removing a photoresist to or from a semiconductor side of a joined substrate. On the other hand, if the content is 80 mole % or less, there is a difference in solubility, appropriate hardness is obtained, and hence a crack is not generated after applying to a silicon substrate.

If the content falls within the range of 50 to 80 mole %, the non-aromatic saturated hydrocarbon group-containing organopolysiloxane cannot be dissolved in a polar solvent having an SP value [a solubility parameter $(cal/cm^3)^{1/2}$] higher than 9, e.g., acetone (SP: 10.0) or N-methylpyrolidone (SP: 11.2), but it can be dissolved in a hydrocarbon based nonpolar solvent, e.g., n-hexane (SP: 7.3) or isododecane (SP: 7.7).

As such a non-aromatic cyclic saturated hydrocarbon group, there are non-aromatic saturated hydrocarbon groups having one of the following cyclic structure such as a cyclohexyl group, a norbornyl group, or norbornylethyl group, especially the cyclohexyl group and the norbornyl group are preferable:

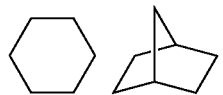

Moreover, to improve a difference in solubility and bonding properties of polysiloxane, the content of an acyclic saturated hydrocarbon group is also important. The content of a substituted or unsubstituted monovalent acyclic saturated hydrocarbon group having a carbon number of 6 to 15 in $R^1$ to $R^3$ is preferably 10 to 40 mole %. An improvement in bonding properties can be expected if the content is 10 mole % or more, and viscosity is not extremely lowered even when a temperature is high and sufficient heat resistance can be obtained if the content is 40 mole % or less.

As such an acyclic saturated hydrocarbon group, there are an n-hexyl group, an octyl group, an n-decyl group, an n-dodecyl group, and others, and the n-hexyl group and the n-dodecyl group are further preferable.

In all organic groups represented by $R^1$ to $R^4$, as groups other than the cyclic or acyclic saturated hydrocarbon group, a substituted or unsubstituted monovalent hydrocarbon group having a carbon number of 1 to 7 is preferable, and there are: an alkyl group such as a methyl group, an ethyl group, a propyl group, a butyl group, and a pentyl group; an aryl group such as a phenyl group and a tolyl group; an aralkyl group such as a benzyl group; an unsaturated hydrocarbon group like an alkenyl group such as a vinyl group, an allyl group, a butenyl group, a pentenyl group, a hexenyl group, and a heptenyl group; an alkyl halide group such as a chloromethyl group, a 3-chloropropyl group, and a 3,3,3-trifluoropropyl group; and others, especially the methyl group, the phenyl group, and the alkenyl group are preferable.

The organopolysiloxane (A-1) which is preferable as non-aromatic saturated hydrocarbon group-containing organopolysiloxane of the component (A) according to the present invention contains 50 to 99 mole % of the T unit, 0 to 49 mole % of the D unit, and 1 to 15 mole % of the M unit as described above.

The non-aromatic saturated hydrocarbon group-containing organopolysiloxane of the component (A) according to the present invention which has a solid form at a temperature that does not exceed 40° C. is preferable when processed.

Containing 50 to 99 mole % of the T unit allows the non-aromatic saturated hydrocarbon group-containing organopolysiloxane of the component (A) to be readily solidified at a temperature that is 40° C. or lower, which is preferable for bonding the substrates.

When 49 mole % or below of the D unit is contained, the non-aromatic saturated hydrocarbon group-containing organopolysiloxane of the component (A) can be readily solidified at 40° C. or below, and the wafer and the support substrate can be sufficiently bonded when this material is used for the temporary adhesive composition.

Further, it is preferable for a reactive terminal group, i.e., silanol or a hydrolyzable residue to not remain in the non-aromatic saturated hydrocarbon group-containing organopolysiloxane of the component (A) in terms of later-described thermal stability. Therefore, a structure that the M unit is introduced to a terminal is preferable, and containing I mole % or more as the content of the M unit is desirable. More preferably, the content is 1 to 15 mole %.

Containing 1 to 15 mole % of the M unit allows the non-aromatic saturated hydrocarbon group-containing organopolysiloxane of the component (A) to have a structure that the reactive terminal group is sufficiently reduced. When the content 1 mole % or more, it is possible to obtain a structure that the reactive terminal group, e.g., silanol or a hydrolyzable residue is sufficiently reduced. Furthermore, when the content is 15 mole % or less, there is no possibility that a molecular weight is relatively reduced because of an extremely large amount of the terminal group, which is preferable.

When a molecular-terminal group not sealed by the M unit, i.e., a hydrolyzable residue such as a silanol group and an alkoxysilyl group is present, reducing the content of these reactive terminal groups as much as possible is preferable. If an amount of the terminal residues such as the silanol group and the alkoxysilyl group in a molecule is small, it is possible to suppress generation of cross-linkage due to a condensation reaction and a great change in delamination properties of the substrate when heat is applied, which is preferable. Moreover, it is preferable for a total amount of an OH group of a silanol group and an OR group of an alkoxysilyl group (Si-OR: OR represents an alkoxy group residue of alkoxysilane used as a starting material, such as a methoxy group, an ethoxy group, an n-propyl group, and an isopropyl group,) to be 5 mass % or less, or preferably 3 mass % or less of total resin solid content. When the M unit is introduced, such a reactive terminal group can be reduced to a desired amount.

The organopolysiloxane having the above-described structure can be manufactured while controlling hydrolysis of the hydrolyzable silane as a starting material and the condensation reaction.

As the hydrolysable silane that can be used as the starting material, there are, e.g., methyltrichlorosilane, phenyltrichlorosilane, n-propyltrichlorosilane, isopropyltrichlorosilane, n-butyltrichlorosilane, isobutyltrichlorosilane, n-pentyltrichlorosilane, isopentyltrichlorosilane, n-hexyltrichlorosilane, cyclohexyltrichlorosilane, n-octyltrichlorosilane, n-decyltrichlorosilane, n-dodecyltrichlorosilane, bicyclo[2.2.1]heptyltrichlorosilane (C1 described below), bicyclo[2.2.1]nonyltrichlorosilane (C2 described below), dimethyldichlorosilane, n-propylmethyldichlorosilane, isopropylmethyldichlorosilane, n-butylmethyldichlorosilane, isobutylmethyldichlorosilane, n-hexylmethyldichlorosilane, n-octylmethyldichlorosilane, n-decylmethyldichlorosilane, n-dodecylmethyldichlorosilane, cyclohexylmethyldichlorosilane, diphenyldichlorosilane, bicyclo[2.2.1]heptylmethyldichlorosilane (C3 described below), bicyclo[2.2.1]nonylmethyldichlorosilane (C4 described below), and materials having a methoxy group or an ethoxy group as a hydrolyzable group of the above-mentioned materials.

In particular, as (C1) to (C4) having a plurality of cyclic structures, there are stereoisomeric forms such as an endo form and an exo form, and they can be all used.

(C1)

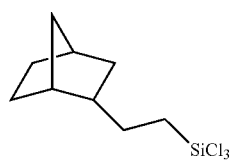

(C2)

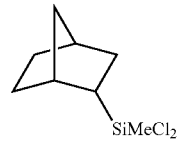

(C3)

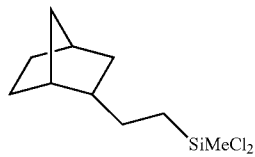

(C4)

A distribution of a molecular weight of the non-aromatic saturated hydrocarbon group-containing polysiloxane of the component (A) is very important. That is, based on the GPC (gel permeation chromatography), a value that is 2,000 or more is preferable as a value of a weight average molecular weight obtained along a calibration curve fabricated using a polystyrene standard substance. A difference in solubility between polar and nonpolar solvent appears when the weight average molecular weight of the non-aromatic saturated hydrocarbon group-containing polysiloxane is 2,000 or more, and a molecular weight of the non-aromatic saturated hydrocarbon group-containing polysiloxane can be stably and reproducibly synthesized. The range of the weight average molecular weight of the non-aromatic saturated hydrocarbon group-containing organopolysiloxane is preferably approximately 3,000 to 50,000 and more preferably approximately 5,000 to 30,000.

As such a GPC apparatus that can conduct such analysis/observational study, HLC-8120GPC, HLC-8220GPC, or HLC-8230GPC manufactured by Tosoh Corporation can be used.

The organopolysiloxane (A-2) is obtained by increasing a molecular weight of the organopolysiloxane (A-1) as a starting material.

It is preferably organopolysiloxane that is obtained by causing a hydrosilylation reaction of alkenyl group containing organopolysiloxane (a1) in the organopolysiloxane represented by (A-1) and organohydrogenpolysiloxane (a2) in the presence of a platinum group metal based catalyst, has a weight average molecular weight of 30,000 to 20,000 (a corresponding value of polystyrene based on GPC) and, is insoluble in a polar solvent having an SP value [a solubility parameter $(cal/cm^3)^{1/2}$], the alkenyl group containing organopolysiloxane (a1) being an alkenyl group in which 2 to 10 mole % in all organic groups represented by $R^1$ to $R^4$ correspond to alkenyl groups each having a carbon number of 2 to 7, the organohydrogenpolysiloxane (a2) being one or more types of organohydrogenpolysiloxane represented by the following general formula (1) having an amount that total SiH groups becomes 0.4 to 1.0-fold of total alkenyl groups of the alkenyl group containing organopolysiloxane (a1),

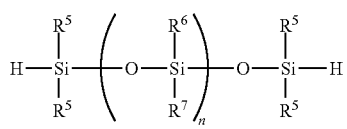

(1)

wherein $R^5$ to $R^7$ may be equal to or different from each other and represent monovalent hydrocarbon groups each having a carbon number of 1 to 12 excluding the alkenyl group, and n represents an integer of 0 to 100.

In this situation, content of the alkenyl group is at least 2 mole % to 10 mole % of all organic groups represented by $R^1$ to $R^4$. When the content of the alkenyl group is 2 mole % or more, a molecular weight based on the hydrosilylation reaction is greatly increased, and organohydrogenpolysiloxane superior in physicality such as heat resistance can be provided, which is preferable. Additionally, when the content is 10 mole % or less, solubility in a polar organic solvent used when applying or removing a photoresist to or from a semiconductor side of a joined substrate is further reduced, which is preferable.

As examples of such alkenyl groups, there are a vinyl group, an allyl group, a butenyl group, a hexenyl group, a cyclohexenyl group, and a norbornenyl group, and the vinyl group is preferable in terms of responsiveness.

As a total SiH amount of the component (a2) with respect to the total alkenyl group of the component (a1), a value of 0.4 to 1.0 is preferable. If the amount is 0.4 or more, an increase in molecular weight is sufficient, and desired heat resistance and bondability can be obtained. Further, if the amount 1.0 or less, cross-linkage of the resin becomes appropriate, gelation hardly occurs, SiH groups remaining in the resin can be reduced, and foaming due to remaining SiH can be suppressed at the time of a heat test after bonding, which is preferable.

As monovalent hydrocarbon groups each having a carbon number 1 to 12 excluding the alkenyl groups of $R^5$ to $R^7$, there are specifically, e.g., a methyl group, a propyl group, a hexyl group, a cyclohexyl group, a phenyl group, a decyl group, and a dodecyl group. In particular, there are preferably the methyl group, the cyclohexyl group, and the phenyl group.

A polymerization degree n of the organohydrogenpolysiloxane represented by the general formula (1) is preferably an integer of 0 to 100, and it is more preferably an integer of 0 to 60. When n is 100 or less, there is no possibility that the hydrosilylation reaction with the alkenyl group of the alkenyl group-containing organopolysiloxane (a1) at the time of synthesis hardly advances, and a sufficient reaction makes progress, and adhesiveness of high-molecular-weight organopolysiloxane and the silicon substrate becomes excellent.

Furthermore, a different type of organohydrogenpolysiloxane may be used and an addition reaction may be effected without departing from the above-described range.

Such organopolysiloxane subjected to an increase in molecular weight is soluble in a nonpolar organic solvent but, on the other hand, it is poorly soluble in a polar organic solvent used when applying or removing a photoresist to or from the semiconductor side of the joined substrate, and also it is superior in bondability and heat resistance.

[Method for Manufacturing High-Molecular-Weight Organopolysiloxane]

As a reaction of the alkenyl group-containing organopolysiloxane (a1) and the organohydrogenpolysiloxane (a2), for example, the alkenyl group-containing organopolysiloxane (a1) is dissolved in an organic solvent, a platinum based metal catalyst as a hydrosilylation catalyst is added, then heating is effected at 50 to 150° C., and the organohydrogenpolysiloxane (a2) is dropped, whereby high-molecular-weight organopolysiloxane can be obtained.

The platinum catalyst is a catalyst used for facilitating a hydrosilylation addition reaction with respect to the SiH group and, as this addition reaction catalyst, there are, e.g., platinum group metal catalysts including a platinum based catalyst such as platinum black, platinum chloride, a chloroplatinic acid, a reactant of the chloroplatinic acid and monovalent alcohol, a complex of the chloroplatinic acid and olefins, and platinum bisacetoacetate; a palladium based catalyst; and a rhodium based catalyst. It is to be noted that a blending amount of this addition reaction catalyst can be a catalytic amount, but it is preferable to blend approximately 1 to 800 ppm, especially, approximately 2 to 300 ppm of the platinum group metal with respect to a weight of the component (a1).

The molecular weight of organopolysiloxane after the hydrosilylation addition reaction affects characteristics of the temporary adhesive, especially thermal deformation at the time of heating, void generation on an adhesive interface, and others.

The weight average molecular weight Mw of the high-molecular-weight polyorganosiloxane after the addition reaction is a value of a weight average molecular weight obtained along a calibration line fabricated by a polystyrene standard substance using the GPC (the gel permeation chromatography), and a value of 30,000 to 200,000 is preferable. If the above-described weight average molecular weight is used, organopolysiloxane which is superior in heat resistance and has no void generated therein can be obtained. As a weight average molecular weight range, a value of approximately 35,000 to 170,000 is preferable, and a value of approximately 40,000 to 150,000 is more preferable.

[Component (B)]

In the composition according to the present invention, the antioxidant of the component (B) is blended to improve thermal stability in particular.

It is preferable for the antioxidant of the component (B) used in the present invention to be at least one compound selected from a group including a hindered phenol based compound, a hindered amine based compound, an organic phosphorous compound, and an organic sulfur compound.

Hindered Phenol Based Compound;

The hindered phenol based compound used in the present invention is not restricted in particular, but the following hindered phenol based compounds are preferable.

1,3,5-trimethyl-2,4,6-tris(3,5-di-t-butyl-4-hydroxybenzyl)benzene (trade name: IRGANOX 1330), 2,6-di-t-butyl-4-methylphenol (trade name: Sumilizer BHT), 2,5-di-t-butyl-hydroquinone (trade name: Nocrac NS-7), 2,6-di-t-butyl-4-ethylphenol (trade name: Nocrac M-17), 2,5-di-t-amylhydroquinone (trade name: Nocrac DAH), 2,2'-methylenebis(4-methyl-6-t-butylphenol) (trade name: Nocrac NS-6), 3,5-di-t-butyl-4-hydroxy-benzylphosphonate-diethylester (trade name: IRGANOX 1222), 4,4'-thiobis (3-methyl-6-t-butylphenol) (trade name: Nocrac 300), 2,2'-methylenebis(4-ethyl-6-t-butylphenol) (trade name: Nocrac NS-5), 4-4'-butylidenebis(3-methyl-6-t-butylphenol) (Adekastab AO-40), 2-t-butyl-6-(3-t-butyl-2-hydroxy-5-methyl-benzyl)-4-methylphenylacrylate (trade name: Sumilizer GM), 2-[1-(2-hydroxy-3,5-di-t-pentylphenyl)ethyl]4,6-di-t-pentylphenylacrylate (trade name: Sumilizer GS), 2,2'-methylenebis[4-methyl-6-(α-methyl-cyclohexyle)phenol], 4,4'-methylenebis(2,6-di-t-butylphenol) (trade name: SEENOX 226M), 4,6-bis(octylthiomethyl)-o-cresol (trade name: IRGANOX 1520L), 2,2'-ethylenebis(4,6-di-t-butylphenol), octadecyl-3-(3,5-di-t-butyl-4-hydroxyphenyl)propionate (trade name: IRGANOX 1076), 1,1,3-tris-(2-methyl-4-hydroxy-5-t-butylphenyl)butane (trade name: Adekastab AO-30), tetrakis[methylene-(3,5-di-t-butyl-4-hydroxyhydrocinnamate)]methane (trade name: Adekastab AO-60), triethyleneglycolbis[3-(3-t-butyl-5-methyl-4-hydroxyphenyl)propionate] (trade name: IRGANOX 245), 2,4-bis-(n- octylthio)-6-(4-hydroxy-3,5-di-t-butylanilino)-1,3,5-triazine (trade name: IRGANOX 565), N,N'-hexamethylenebis(3,5-di-t-butyl-4-hydroxy-hydrocinnamamide) (trade name: IRGANOX 1098), 1,6-hexanediol-bis[3-(3,5-di-t-butyl-4-hydroxyphenyl)propionate] (trade name: IRGANOX 259), 2,2-thio-diethylenebis[3-(3,5-di-t-butyl-4-hydroxyphenyl) propionate] (trade name: IRGANOX 1035), 3,9-bis[2-[3-(3-t-butyl-4-hydroxy-5-methylphenyl)propionyloxy]1,1-dimethylethyl]2,4,8,10-tetraoxaspiro[5,5]undecane (trade name: Sumilizer GA-80), tris-(3,5-di-t-butyl-4-hydroxybenzyl)isocyanurate (trade name: IRGANOX 3114), bis(3,5-di-t-butyl-4-hydroxybenzyl ethyl phosphonate)calcium/polyethylene wax mixture (50:50) (trade name: IRGANOX 1425WL), isooctyl-3-(3,5-di-t-butyl-4-hydroxyphenyl)propionate (trade name: IRGANOX 1135), 4,4'-thiobis(6-t-butyl-3-methylphenol) (trade name: Sumilizer WX-R), 6-[3-(3-t-butyl-4-hydroxy-5-methylphenyl)propoxy]-2,4,8,10-tetra-t-butyldibenz[d,f][1,3,2]dioxaphosphepine (trade name: Sumilizer GP), and others.

Hindered Amine Based Compound;

The hindered amine based compound used in the present invention is not restricted in particular, but the following hindered amine based compounds are preferable.

P,p'-dioctyldiphenylamine (trade name: IRGANOX 5057), phenyl-α-naphtylamine (trade name: Nocrac PA), poly(2,2,4-trimethyl-1,2-dihydroquinoline) (trade name: Nocrac 224, 224-S), 6-ethoxy-2,2,4-trimethyl-1,2-dihydroquinoline (trade name: Nocrac AW), N,N'-diphenyl-p-phenylenediamine (trade name: Nocrac DP), N,N'-di-β-naphtyl-p-phenylenediamine (trade name: Nocrac White), N-phenyl-N'-isopropyl-p-phenylenediamine (trade name: Nocrac 810NA), N,N'-diallyl-p-phenylenediamine (trade name: Nonflex TP), 4,4'(α,α-dimethylbenzyl)diphenylamine (trade name: Nocrac CD), p,p-toluenesulfonylaminodiphenylamine (trade name: Nocrac TD), N-phenyl-N'-(3-methachloryloxy-2-hydroxypropyl)-p-phenylenediamine (trade name: Nocrac G1), N-(1-methylheptyl)-N'-phenyl-p-phenylenediamine (trade name: Ozonon 35), N,N'-di-sec-butyl-p-phenylenediamine (trade name: Sumilizer BPA), N-phenyl-N'-1,3-dimethylbutyl-p-phenylenediamine (trade name: Antigene 6C), alkylated diphenylamine (trade name: Sumilizer 9A), succinate dimethyl-1-(2-hydroxyethyl)-4-hydroxy-2,2,6,6-tetramethylpiperidine polycondensate (trade name: Tinuvin 622 LD), poly[[6-(1,1,3,3-tetramethylbutyl)amino-1,3,5-triazine-2,4-diyl][(2,2,6,6-tetramethyl-4-piperidyl)imino]hexamethylene [(2,2,6,6-tetramethyl-4-piperidyl)imino]] (trade name: CHIMASSORB 944), N,N'-bis(3-aminopropyl) ethylenediamine-2,4-bis[N-butyl-N-(1,2,2,6,6-pentamethyl-4-piperidyl)amino]-6-chloro-1,3,5-triazine condensate (trade name: CHIMASSORB 119FL), bis(1-octyloxy-2,2,6,6-tetramethyl-4-piperidyl)sebacate (trade name: TINUVIN 123), bis(2,2,6,6-tetramethyl-4-piperydil)sebacate (trade name: TINUVIN 770), 2-(3,5-di-t-butyl-4-hydroxybenzyl)-2-n-butyl malonate bis(1,2,2,6,6-pentamethyl-4-piperidyl) (trade name: TINUVIN 144), bis(1,2,2,6,6-pentamethyl-4-piperidyl)sebacate (trade name: TINUVIN 765), tetrakis(1,2,2,6,6-pentamethyl-4-piperidyl)1,2,3,4-butanetetracarboxylate (trade name: LA-57), tetrakis(2,2,6,6-tetramethyl-4-piperidyl)1,2,3,4-butanetetracarboxylate (trade name: LA-52), a mixed ester compound of 1,2,3,4-butanetetracalboxylate, and 1,2,2,6,6-pentamethyl-4-piperidinol and 1-tridecanol (trade name: LA-62), a mixed ester compound of 1,2,3,4-butanetetracarboxylate, and 2,2,6,6-tetramethyl-4-piperidynol and 1-tridecanol (trade name: LA-67), a mixed ester compound of 1,2,3,4-butanetetracarboxylate, and 1,2,2,6,6-pentamethyl-4-piperidinol and 3,9-bis(2-hydroxy-1,1-dimethylethyl)-2,4,8,10-tetraoxaspiro[5.5]undecane (trade name: LA-63P), a mixed ester compound of 1,2,3,4-butanetetracarboxylate, 2,2,6,6-tetramethyl-4-piperidynol, and 3,9-bis(2-hydroxy-1,1-dimethylethyl)-2,4,8,10-tetraoxaspiro [5.5]undecane (trade name: LA-68LD), (2,2,6,6-tetramethylene-4-piperidyl)-2-propylenecarboxylate (trade name: Adekastab LA-82), (1,2,2,6,6-pentamethyl-4-piperidyl)-2-propylenecarboxylate (trade name: Adekastab LA-87), and others.

Organic Phosphorous Compound;

Although the organic phosphorous compound used in the present invention is not restricted in particular, the following organic phosphorous compounds are preferable.

Bis(2,4-di-t-butylphenyl)[1,1-biphenyl]-4,4'-diylbisphosphite, 9,10-dihydro-9-oxa-10-phosphaphenanthrene-10-oxide (trade name: SANKO-HCA), triethylphosphite (trade name: JP302), tri-n-butylphosphite (trade name: 304), triphenylphosphite (trade name: Adekastab TPP), diphenylmonooctylphosphite (trade name: Adekastab C), tri(p-cresyl) phosphite (trade name: Chelex-PC), diphenylmonodecylphosphite (trade name: Adekastab 135A), diphenylmono(tridecyl)phosphite (trade name: JPM313), tris(2-ethylhexyl)phosphite (trade name: JP308), phenyldidecylphosphite (trade name: Adekastab 517), tridecylphosphite (trade name: Adekastab 3010), tetraphenyldipropyleneglycoldiphosphite (trade name: JPP100), bis(2,4-di-t-butylphenyl)pentaerythritoldiphosphite (trade name: Adekastab PEP-24G), tris(tridecyl)phosphite (trade name: JP333E), bis(nonylphenyl)pentaerythritoldiphosphite (trade name: Adekastab PEP-4C), bis(2,6-di-t-butyl-4-methylphenyl)pentaerythritoldiphosphite (trade name: Adekastab PEP-36), bis[2,4-di(1-phenylisopropyl)phenyl]pentaerythritoldiphosphite (trade name: Adekastab PEP-45), trilauryltrithiophosphite (trade name: JPS312), tris(2,4-di-t-butylphenyl)phosphite (trade name: IRGAFOS 168), tris (nonylphenyl)phosphite (trade name: Adekastab 1178), distearylpentaerythritoldiphosphite (trade name: Adekastab PEP-8), tris(mono,dinonylphenyl)phosphite (trade name: Adekastab 329K), trioleylphosphite (trade name: Chelex-OL), tristearylphosphite (trade name: JP318E), 4,4'-butylidenebis(3-methyl-6-t-butylphenylditridecyl)phosphite (trade name: JPH1200), tetra(C12-C15 mixed alkyl)-4,4'-isopropylidenediphenyldiphosphite (trade name: Adekastab 1500), tetra(tridecyl)-4,4'-butylidenebis(3-methyl-6-t-butylphenol)diphosphite (trade name: Adekastab 260), hexa (tridecyl)-1,1,3-tris(2-methyl-5-t-butyl-4-hydroxyphenyl) butane-triphosphite (trade name: Adekastab 522A), a hydrogenated bisphenol A phosphite polymer (HBP), tetrakis (2,4-di-t-butylphenyloxy)4,4'-biphenylene-di-phosphine (trade name: P-EPQ), tetrakis(2,4-di-t-butyl-5-methylphenyloxy)4,4'-biphenylene-di-phosphine (trade name: GSY-101P), 2-[[2,4,8,10-tetrakis(1,1-dimethylethyl)dibenzo[d,f] [1,3,2]dioxaphosphepin6-yl]oxy]-N,N-bis[2-[[2,4,8,10-tetrakis(1,1-dimethylethyl)dibenzo[d,f][1,3,2,] dioxaphosphepin-6-yl]oxy]-ethyl]ethanamine (trade name: IRGAFOS 12), 2,2'-methylenebis(4,6-di-t-butylphenyl)octylphosphite (trade name: Adekastab HP-10), and others.

Organic Sulfur Compound;

Although the organic sulfur compound used in the present invention is not restricted in particular, the following organic sulfur compounds are preferable.

Dilauryl-3,3'-thiodipropionate (trade name: Sumilizer TPL-R), dimyristyl-3,3'-thiodipropionate (trade name: Sumilizer TPM), distearyl-3,3'-thiodipropionate (trade name: Sumilizer TPS), pentaerythritoltetrakis(3-laurylthiopropionate) (trade name: Sumilizer TP-D), ditridecyl-3,3'-thiodipropionate (trade name: Sumilizer TL), 2-mercaptobenzimidazole (trade name Sumilizer MB), ditridecyl-3,3'- thiodipropionate (trade name: Adekastab AO-503A), 1,3,5-tris-β-stearylthiopropionyloxyethylisocyanurate, 3,3'-thiobispropionatedidodecylester (trade name: IRGANOX PS 800FL), 3,3'-thiobispropionatedioctadecylester (trade name: IRGANOX PS 802FL), and others.

Among the above-described antioxidants, taking compatibility of the non-aromatic saturated hydrocarbon group-containing organopolysiloxane of the component (A) and the organic solvent of the component (C) into consideration, there are particularly preferably Adekastab AO-60, IRGANOX 1076, IRGANOX 1135, IRGANOX 1520L (which are trade names), and others.

An additive amount of the component (B) is 0.5 to 5 parts by mass or preferably 1 to 3 parts by mass with respect to 100 parts by mass of the component (A). A sufficient heat resisting effect cannot be obtained if the additive amount is smaller than these values, and the compatibility cannot be obtained when the organic solvent of the component (C) is added if the additive amount is higher than these values.

It is to be noted that the component (B) is not restricted to one type, and a plurality of types may be used at the same time.

[Component (C)]

The organic solvent of the component (C) is preferably has an SP value [a solubility parameter $(cal/cm^3)^{1/2}$] which is 9 or lower, and it preferably dissolves the non-aromatic saturated hydrocarbon group-containing organopolysiloxane of the component (A) and the antioxidant of the component (B) and forms a thin film having a film thickness of 1 to 200 µm by a known film-forming method such as spin coating. At this time, the film thickness is preferably 5 to 180 µm or more preferably 30 to 150 µm.

As the organic solvent (C) that dissolves the components (A) and (B), solvents other than a polar medium such as keton, ester, and alcohol can be used, and non-aromatic hydrocarbon is preferable.

Although specific examples of such an organic solvent (C) are not restricted in particular, there are pentane, hexane, cyclopetane, cyclohexane, methylcyclohexane, octane, isooctane, decane, undecane, isododecane, limonene, pinene, and others.

Among these solvents, as the organic solvent (C) that provides a temporary adhesive composition which can be subjected to spin coating and has high safety, a hydrocarbon solvent having a boiling point of 120 to 240° C. is preferable. That is, in light of this point, octane, isooctane, decane, isodecane, dodecane, isododecane, limonene is preferable. If the boiling point is 120° C. or above, a flash point of the hydrocarbon solvent is also high, which is preferable. Moreover, if the boiling point is 240° C. or below, the hydrocarbon solvent is apt to be volatilize in drying by heat after coating the hydrocarbon solvent, and it hardly stays in the film. Therefore, when the temporary adhesive composition is exposed to a high temperature during a heating process after bonding the substrates, formation of air bubbles on the bonded surface can be suppressed, which is preferable.

An additive amount of the component (C) is 10 to 1000 parts by mass or preferably 20 to 200 parts by mass with respect to 100 parts by mass of the component (A). Viscosity of the temporary adhesive composition is too high and the wafer cannot be coated if the additive amount is smaller than these values, and a sufficient film thickness cannot be obtained after coating if the additive amount is higher than these values.

It is to be noted that the component (C) is not restricted to one type, and a plurality of types may be used at the same time.

[Other Components]

Besides the above-described components, components used for a regular temporary adhesive composition can be added to the temporary adhesive composition according to the present invention.

For example, to improve coating properties, a known surfactant agent may be added to the temporary adhesive composition according to the present invention. Although not restricted in particular, specifically, there are polyoxyethylenealkyl ethers such as polyoxyethylenelaurylether, polyoxyethylenestearylether, polyoxyethylenecetylether, and polyoxyethyleneoleinether, polyoxyethylenealkylaryl ethers such as polyoxyethyleneoctylphenolether and polyoxyethylenenonylphenolether, polyoxyethylenepolyoxypropylene block copolymers, sorbitan fatty acid esters such as sorbitanmonolaurate, sorbitanmonopalmitate, and sorbitanstearate, a non-ionic surfactant of polyoxyethylene sorbitan fatty acid ester such as polyoxyethylenesorbitanmonolaurate, polyoxyethylenesorbitanmonopalmitate, polyoxyethylenesorbitanmonostearate, polyoxyethylenesorbitantrioleate, and polyoxyethylenesorbitantristearate, a fluorochemical surfactant such as F-top EF301, EF303, and EF352 (Tokem Products), Megaface F171, F172, and F173 (Dainippon Ink And Chemicals, Incorporated), Fluorad FC430 and FC431 (Sumitomo 3M), AsahiGuard AG710, Surflon S-381, S-382, SC101, SC102, SC103, SC104, SC105, SC106, Surfynol E1004, KH-10, KH-20, KH-30, and KH-40 (Asahi Glass Co., Ltd.), organosiloxane polymers KP341, X-70-092, X-70-093 (Shin-Etsu Chemical Co., Ltd.), and acrylic acid based or methacrylic acid based polyflow No. 75 and No. 95 (Kyoeisha Yushi Kagaku Kogyo Co., Ltd.). These materials can be solely used, or two or more types can be combined and used.

<Method for Manufacturing Thin Wafer>

Further, according to the present invention, there is provided a method for manufacturing a thin wafer by bonding a wafer having a circuit forming surface and a circuit non-forming surface to a support substrate and performing grinding, comprising:

a bonding step of forming an adhesion layer on at least one of the circuit forming surface and the support substrate surface by using the temporary adhesive composition, and bonding the circuit forming surface of the wafer to support substrate through the adhesion layer;

a grinding step of grinding the circuit non-forming surface of the wafer bonded to the support substrate;

a delaminating step of delaminating the ground wafer from the support substrate; and a removing step of removing the adhesion layer remaining on the circuit forming surface of the delaminated wafer.

The method for manufacturing a thin wafer according to the present invention is characterized in that the above-mentioned temporary adhesive composition is used as an adhesion layer of a wafer having a semiconductor circuit and a support substrate used for reducing a thickness of the wafer. Although a thickness of a thin wafer obtained by the manufacturing method of the present invention is not restricted in particular, it is typically 300 to 5 µm or more typically 100 to 10 µm.

[Bonding Step]

The bonding step is a step of forming an adhesion layer by using the temporary adhesive composition according to the present invention on at least one of a circuit forming surface and a support substrate surface and bonding the circuit forming surface of the wafer to the support substrate through the adhesion layer. The wafer is a wafer having one surface serving as the circuit forming surface where circuits are formed and the other surface serving as a circuit non-forming surface.

Although the wafer to which the present invention can be applied is not restricted in particular, it is usually a semiconductor wafer. As examples of the wafer, there are not only a silicon wafer but also a germanium wafer, a gallium arsenic wafer, a gallium phosphide wafer, a gallium arsenic aluminum wafer, and others. The wafer in the bonding step is a wafer that is yet to be subjected backgrinding at the grinding step, and a thickness of the wafer is not restricted in particular, but it is typically 800 to 600 pa or more typically 775 to 625 μm.

As the support substrate, it is possible to use, e.g., a silicon wafer, a glass wafer, or a quartz wafer. In the present invention, radiation energy rays do not have to be applied to the adhesion layer through the support substrate, and light ray permeability of the support substrate is not required.

The adhesion layer is formed by using the temporary adhesive composition according to the present invention based on, e.g., spin coating. The adhesion layer is formed on the circuit forming surface and/or the support substrate of the wafer. The wafer is bonded to the support substrate through the thus formed adhesion layer. In case of forming the adhesion layer to the wafer, this layer is formed on the circuit forming surface of the wafer.

The adhesion layer formed by using the temporary adhesive composition according to the present invention is softened by heating. A temperature range that a resin in the adhesion layer is softened is 80 to 320° C., preferably 100 to 300° C., or more preferably 120 to 260° C., and a joined substrate having the wafer bonded to the support substrate is formed by uniformly pressure-bonding both the substrates (i.e., the wafer and the support substrate) at this temperature under reduced pressure. The inside of a chamber in which both the substrates are installed is heated in the temperature range under reduced pressure, the resin in the adhesion layer is partially softened or molten, then both the substrates are brought into contact with each other, and heat pressure bonding is effected, whereby a uniform bonding interface can be formed without interposing air bubbles in the interface. When bonding the wafer to the support substrate through the adhesion layer, it is preferable for a temperature of the support substrate to fall within the range of temperature range. Since the resin in the adhesion layer is sufficiently softened at such bonding temperatures, irregularities present on the surface of the wafer to be bonded can be filled without gaps. When a load at the time of pressure bonding is 20 kN or lower, preferably 10 kN or lower, or more preferably 7 kN or lower in, e.g., 8-inch wafer (a diameter: 200 mm), bonding can be performed.

As wafer bonders, there are commercially available wafer bonders, e.g., EVG520IS and 850TB manufactured by EVG, XBC300 manufactured by SUSS, and others.

[Grinding Step]

The grinding step is a step of grinding the circuit non-forming surface of the wafer having the support substrate bonded thereto. That is, it is a step of grinding a wafer back side of a laminated substrate bonded at the bonding step and reducing a thickness of the wafer. A system of a grinding process for the wafer back side is not restricted in particular, and a known grinding system such as a flat-surface grinding machine is adopted. It is preferable to perform grinding while watering and cooling the wafer and a grind stone. As an apparatus that grinds the wafer back side, there is DAG-810 (trade name) manufactured by DISCO Corporation or the like.

[Processing Step]

The method for manufacturing a thin wafer according to the present invention can include a processing step after the grinding step and before the delaminating step. The processing step is a step of processing the circuit non-forming surface side of the wafer having the ground circuit non-forming surface, i.e., the wafer whose thickness has been reduced by backgrinding. Although this step includes various processes used in a wafer level, there are, e.g., formation of an electrode on the circuit non-forming surface, formation of a metal wiring, formation of a top coat, and others, for example. More specifically, there are conventionally known processes such as metal sputtering for forming an electrode and others, wet etching for etching a metal sputtering layer, application of a resist which is used as a mask in metal wiring formation, formation of a pattern by exposure and development, delamination of the resist, dry etching, formation of metal plating, silicon etching for forming TSV, formation of an oxide film on a silicon surface, and others.

[Delaminating Step]

The delaminating step is a step of delaminating the ground wafer from the support substrate at the adhesion layer. That is, it is a step of delaminating from the support substrate after applying various kinds of processing to the thinned wafer and before performing dicing. As delamination methods, there are many suggestions, e.g., a method of mainly sliding the wafer and the support substrate in horizontally opposite directions while heating and separating both the substrates from each other, a method of horizontally fixing one of laminated substrates in advance and lifting up the other substrate from the horizontal direction at a fixed angle while heating, a method of attaching a protective film on the ground surface of the ground wafer and delaminating the wafer and the protective film based on the peel system, and others.

All of these delamination methods can be applied to the present invention, the horizontal slide delamination system is further suitable.

A laminated body comprising the wafer, the adhesion layer, and the support substrate are heated, force is applied in a state that the adhesion layer is molten or softened, and the wafer can be thereby delaminated from the support substrate. In the adhesion layer used in the present invention, a heating temperature is preferably 50 to 300° C., more preferably 60 to 230° C., further preferably 70 to 220° C.

As an apparatus that carries out such delamination, there is EVG850DB manufactured by EVG or XBC300 manufactured by SUSS (which are trade names).

[Removing Step]

The removing step is a step of removing the adhesion layer remaining on the circuit forming surface of the delaminated wafer. The remaining adhesion layer can be removed by, e.g., cleaning the wafer.

In the removing step, all kinds of cleaning liquids can be used as long as the cleaning liquids can dissolve the resin in the adhesion layer, especially organopolysiloxane of the component (A) and, specifically, the organic solvent (C) can be used. These solvents may be solely used, or two or more types may be combined and used.

Furthermore, when the adhesion layer remaining on the circuit forming surface is hard to be removed, bases or acids may be added to the solvents. As examples of the bases, it is possible to use amines such as ethanol amine, diethanol amine, triethanol amine, triethyl amine, and ammonia, and ammonium salts such as tetoramethylammoniumhydroxide. As acids, it is possible to use organic acids such as an acetic acid, an oxalic acid, a benzenesulfonic acid, and dodecylbenzenesulfonic acid. An additive amount of each of these bases and acids can be set to 0.01 to 10 mass % or preferably 0.1 to 5 mass %.

Moreover, removal properties of the adhesion layer remaining on the circuit forming surface, an existing surfactant may be added.

As a cleaning method, it is possible to adopt a method of performing cleaning in a paddle using the cleaning liquid, a cleaning method based on spray atomization, or a method of immersing in a cleaning liquid tank. A temperature of 10 to 80° C. or preferably 15 to 65° C. is suitable.

When such a method for manufacturing a thin wafer is adopted, the wafer can be delaminated from the support substrate in a short time at the delaminating step, the wafer is not delaminated from the support substrate even if a photoresist is applied or removed to or from the semiconductor side of the joined substrate during the manufacturing process of the thin wafer, and the thin wafer can be highly efficiently produced.

EXAMPLES

Synthesis examples, examples, and comparative examples will now be described hereinafter to explain the present invention in more detail, but the present invention is not restricted thereto.

Synthesis of Organopolysiloxane

Synthesis 1

In a 1 L flask having an agitation apparatus, a cooling apparatus, and a temperature gauge disposed thereto, 234 g (13 mole) of water and 35 g of toluene were put and heated to 80° C. in an oil bath. 108.8 g (0.5 mole) of cyclohexyltrichlorosilane, 65.9 g (0.3 mole) of n-hexyltrichlorosilane, 12.9 g (0.1 mole) of dimethyldichlorosilane, and 10.9 g (0.1 mole) of trimethylchlorosilane were put in a dropping funnel, dropping was performed for one hour while agitating the inside of the flask, and agitation maturing was effected at 80° for one hour after end of dropping. A stationary state was maintained while cooling to a room temperature, a separated water phase was removed, a 10% sodium sulfate aqueous solution was continuously mixed, agitation was effected for 10 minutes, the stationary state was maintained for 30 minutes, the separated water phase was removed, and this aqueous cleaning operation was repeated until a toluene phase becomes neutral, and a reaction was stopped. An ester adapter was disposed, the toluene phase containing organopolysiloxane was heated to reflux, water was removed from the toluene phase, this operation was continued for one hour after an inner temperature reached 110° C., and cooling to the room temperature was effected. The obtained organopolysiloxane solution was filtered to remove insoluble matters, toluene was continuously removed by distillation under reduced pressure, and 119.1 g of solid organopolysiloxane (A-I) was obtained.

The obtained organopolysiloxane (A-I) contained 80 mole % of the T unit, 10 mole % of the D unit, and 10 mole % of the M unit, a terminal thereof contained 0.06 mole of a silanol group per 100 g of organopolysiloxane (A-I), an appearance thereof was a clear and colorless solid, and a weight average molecular weight thereof was 44,000. Content of cyclohexyl groups in all organic groups was 38 mole %, and content of n-hexyl groups in the same was 23 mole %. Furthermore, 50 mole % in all organic groups represented by $R^1$ to $R^3$ corresponds to the cyclohexyl groups, and 30 mole % in the same corresponds to the n-hexyl groups.

Synthesis Example 2-1

468 g (26 mole) of water and 70 g of toluene were put in a 2 L flask and heated to 80° C. in an oil bath by the same technique as that in Synthesis Example 1. Preparation was performed in the same manner as Synthesis Example 1 except that 275.6 g (1.2 mole) of norbornyltrichlorosilane, 65.8 g (0.3 mole) of n-hexyltrichlorosilane, 25.8 g (0.2 mole) of dimethyldichlorosilane, 14.2 g (0.1 mole) of methylvinyldichlorosilane, and 21.8 g (0.2 mole) of trimethylchlorosilane were put in a dropping funnel, and 228.8 g of solid organopolysiloxane was obtained.

The obtained organopolysiloxane contained 75 mole % of the T unit, 15 mole % of the D unit, and 10 mole % of the M unit and contained 0.07 mole of a silanol group and 0.039 mole of a vinyl group per 100 g. An appearance thereof was a clear and colorless solid, and a weight average molecular weight thereof was 9,300. Content of norbornyl groups in all organic groups was 44 mole %, content of n-hexyl groups in the same was 11 mole %, and content of the vinyl groups in the same was 3.7 mole %. Furthermore, 57 mole % in all organic groups represented by $R^1$ to $R^3$ corresponds to the norbornyl groups, and 14% in the same corresponds to the n-hexyl groups.

Synthesis Example 2-2

As alkenyl group-containing organopolysiloxane, 100 g of solid organopolysiloxane obtained in Synthesis Example 2-1 was dissolved in 100 g of toluene, and a solution having solid content concentration of 50% was prepared. 20 ppm of platinum catalyst was added in terms of platinum atoms with respect to a resin, temperature was raised to 60° C., 44.6 g (this amount corresponds to 0.5 in an H/Vi ratio (a ratio of SiH groups with respect to total alkenyl groups)) of a compound represented by the following formula (2) (an SiH equivalent amount: 2287 g/mole) was dropped as a hydrosilyl group-containing compound in this state, and heat generation due to a reaction was observed. A reaction was carried out for two hours at 100° C., and the reaction was completed. Then, condensation was performed by distillation under reduced pressure, toluene was removed, a reaction product was solidified, and organopolysiloxane (A-II) was obtained. Moreover, a weight average molecular weight Mw of this resin was measured by GPC, and its result was 41,000,

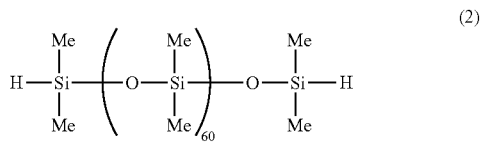

(2)

wherein Me represents a methyl group.

Synthesis Example 3-1

Like Synthesis Example 1, 234 g (13 mole) of water and 35 g of toluene were put in a 1 L flask and heated to 80° C. in an oil bath. Preparation was performed in the same manner as Synthesis Example 1 except that 160.7 g (0.7 mole) of norbornyltrichlorosilane, 45.6 g (0.15 mole) of n-dodecyltrichlorosilane, 7.1 g (0.05 mole) of methylvinyldichlorosilane, and 10.9 g (0.1 mole) of trimethylchlorosilane were put in a dropping funnel, and 143.8 g of solid organopolysiloxane was obtained.

The obtained organopolysiloxane contained 85 mole % of the T unit, 5 mole % of the D unit, and 10 mole % of the M unit and contained 0.1 mole of a silanol group and 0.034 mole of a vinyl group per 100 g. An appearance thereof was a clear and colorless solid, and a weight average molecular weight thereof was 6,100. Content of norbornyl groups in all organic groups was 56 mole %, content of n-dodecyl groups in the same was 12 mole %, and content of the vinyl groups in the same was 4.0 mole %. Furthermore, 74% in all organic groups represented by $R^1$ to $R^3$ corresponds to the norbornyl groups, and 16% in the same corresponds to the n-dodecyl groups.

Synthesis Example 3-2

The same reaction as that in Synthesis Example 2-2 was carried out except that 100 g of the solid organopolysiloxane obtained in Synthesis Example 3-1 was used as alkenyl group-containing organopolysiloxane and 31.6 g (this amount corresponds to 0.6 in terms of an H/Vi ratio) of a compound (an SiH equivalent amount: 1547 g/mole) represented by the following formula (3) was used as a hydrosilyl group-containing compound, and organopolysiloxane (A-III) having a weight average molecular weight of 46,400 was obtained.

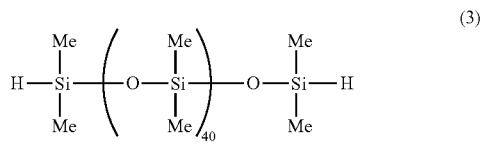

(3)

The respective types of organopolysiloxane A-I, A-II, and A-III synthesized in Synthesis Example as the component (A), the component (B), and the component (C) were blended based on combinations shown in Table 1, then agitation, mixture, and dissolution were performed, microfiltration was carried out by using a 0.2-micron filter made of Teflon (a registered trademark), and the temporary adhesive compositions according to the present invention as Examples 1 to 3 and temporary adhesive compositions as Comparative Examples 1 to 3 were obtained.

Examples 1 to 3, Comparative Examples 1 to 3

Each composition shown in Examples 1 to 3 and Comparative Examples 1 to 3 in Table I was used, and an adhesion layer with each film thickness shown in Table 1 was formed by spin coating on an 8-inch silicon wafer (a diameter: 200 mm, a thickness: 725 μm) having a circuit formed on one surface thereof. An appearance was confirmed based on the following procedure, an 8-inch glass substrate (a glass wafer) was used as a support substrate, this support substrate was bonded to the silicon wafer having the adhesion layer at each adhesion temperature shown in Table 1 in a vacuum bonder, and a laminated body comprising the wafer, the adhesion layer, and the support substrate was fabricated. Subsequently, the following test was conducted. Moreover, in regard to solvent resistance, a test substrate was additionally fabricated and evaluated. Table 1 shows a results.

[Appearance]
A coating film after spin coating was dried on a hot plate at 150° C. for two minutes, the solvent in the film was completely removed, a film appearance was visually confirmed, and tackiness was confirmed by finger touching. A film having no crack and no tack is indicated as good and a film on which a crack or tack can be observed is indicated as bad.

[Adhesiveness Test]
The 8-inch wafers were bonded by using a wafer bonder 520IS manufactured by EVG. The process was carried out at a bonding temperature shown in Table 1 with pressure in a chamber of $10^{-3}$ mbar or below at the time of bonding and a load of 5 kN. After bonding, a bonding situation on the interface was visually confirmed after cooling to the room temperature, and a situation that abnormality such as air bubbles on the interface did not occur is represented as good whilst a situation where abnormality occurred is represented as bad.

[Backgrinding Resistance Test]
Backgrinding of the silicon substrate was performed by using a grinder (DAG810 manufactured by DISCO). After grinding to reach a final substrate thickness of 50 μm, whether abnormality such as a crack or delamination is present was checked by using an optical microscope. A situation where abnormality did not occur is represented as good whilst a situation where abnormality occurred is represented as bad.

[Heat Resistance Test]
The laminated body after performing backgrinding to the silicon substrate was put in an oven at 250° C. in a nitrogen atmosphere for two hours, then heating was effected on a hot plate at 270° C. for 10 minutes, and whether the appearance has abnormality was checked. A situation where abnormality on the appearance did not occur is represented as good whilst a situation where abnormality on the appearance occurred is represented as bad.

[Delamination Property Test]
The laminated substrate subjected to the heat resistance test was again heated to 220° C. by EVG850DB manufactured by EVG, and the wafer and the support substrate were slid in horizontally opposite directions and separated from each other. A situation where separation was successful is represented as good, and a situation where separation failed was represented as bad.

[Washability Test]
Puddle cleaning was performed with respect to the circuit forming surface of the wafer after the delamination property test by using isododecane for 300 seconds. After cleaning, the circuit forming surface of the wafer was observed, and a surface where residues were no observed is determined as good whilst a surface where residues was observed is determined as bad.

[Solvent Resistance Test]
Each composition of Examples 1 to 3 and Comparative Examples 1 to 3 was used to form a film having a thickness of 30 μm on a 6-inch wafer (a diameter: 150 mm), and this wafer was dried by heating at 150° C. for two minutes and then at 200° C. for two minutes. Thereafter, this film was immersed in an N-methylpyrrolidon (NMP) solution at 25° C. for 10 minutes and whether dissolution occurred was visually checked. A film in which dissolution of the resin was not observed is determined as good, and a film in which dissolution of the resin was observed was determined as bad.

TABLE 1

|  | Example 1 | Comparative Example 1 | Example 2 | Comparative Example 2 | Example 3 | Comparative Example 3 |
|---|---|---|---|---|---|---|
| Component A (100 parts by mass) | A-I | A-I | A-II | A-II | A-III | A-III |

TABLE 1-continued

|  | Example 1 | Comparative Example 1 | Example 2 | Comparative Example 2 | Example 3 | Comparative Example 3 |
|---|---|---|---|---|---|---|
| Component B (part by mass) | Adekastab AO-60 (1) | None | IRGANOX 1135 (1) | None | IRGANOX 1520L (1) | None |
| Component C (part by mass) | Isododecane (49.3) | Isododecane (49.3) | Isododecane (49.3) | Isododecane (49.3) | Isododecane (49.3) | Isododecane (49.3) |
| Film thickness μm | 31 | 30 | 31 | 30 | 31 | 30 |
| Appearance | Good | Good | Good | Good | Good | Good |
| Bonding temperature | 200° C. | 200° C. | 190° C. | 190° C. | 180° C. | 180° C. |
| Adhesiveness | Good | Good | Good | Good | Good | Good |
| Backgrinding resistance | Good | Good | Good | Good | Good | Good |
| Heat resistance | Good | Bad | Good | Bad | Good | Bad |
| Delamination properties | Good | Good | Good | Good | Good | Good |
| Washability | Good | Good | Good | Good | Good | Good |
| Solvent resistance | Good | Good | Good | Good | Good | Good |

As shown in Table 1, although voids are generated during the heat resistance test in Comparative Example 1 to 3 in which the antioxidant of the component (B) is not added, Examples 1 to 3 show excellent heat resistance due to an effect of the antioxidant. That is, the temporary adhesive composition according to the present invention containing organopolysiloxane and the antioxidant can meet the above required characteristics.

As mentioned above, the temporary adhesive composition according to the present invention can have excellent adhesiveness, and can be dissolved in a nonpolar organic solvent but poorly dissolved in a polar organic solvent used when applying or removing a photoresist to or from the semiconductor side of the joined substrate, and can also have excellent heat resistance. Additionally, according to the method for manufacturing a thin wafer of the present invention, the wafer can be delaminated from the support substrate in a short time at the delamination step, the wafer is not delaminated from the support substrate even if the photoresist is applied or removed to or from the semiconductor side of the joined substrate during the manufacturing process of a thin wafer, and hence the thin wafer can be highly efficiently produced.

It is to be noted that the present invention is not restricted to the foregoing embodiments. The embodiments are merely illustrative examples, and whatever having the substantially same configurations as the technical concept recited in the appended claims and exhibiting the same functions and effects are embraced within the technical scope of the present invention.

What is claimed is:

1. A temporary adhesive composition comprising:
   (A) non-aromatic saturated hydrocarbon group-containing organopolysiloxane;
   (B) an antioxidant; and
   (C) an organic solvent,
   wherein the component (A) corresponds to 100 parts by mass, the component (B) corresponds to 0.5 to 5 parts by mass, and the component (C) corresponds to 10 to 1000 parts by mass, and
   wherein the non-aromatic saturated hydrocarbon group-containing organopolysiloxane of the component (A) is organopolysiloxane (A-1) that has a weight average molecular weight of 2,000 to 60,000, is insoluble in a polar solvent having an SP value higher than 9, and contains units represented by the following (I) to (III) or organopolysiloxane (A-2) obtained by increasing a molecular weight using the organopolysiloxane (A-1) as a starting material:
   (I) a siloxane unit represented by $R^1SiO_{3/2}$ (a T unit): 50 to 99 mole %;
   (II) a siloxane unit represented by $R^2R^3SiO_{2/2}$ (a D unit): 0 to 49 mole %; and
   (III) a siloxane unit represented by $R^4{}_3SiO_{1/2}$ (an M unit): 1 to 15 mole %,
   wherein each of $R^1$ to $R^4$ represents a monovalent organic group, 50 to 80 mole % in all organic groups represented by $R^1$ to $R^3$ represent the same or different non-aromatic saturated hydrocarbon groups including one of the following cyclic structures, and 10 to 40 mole % are the same or different substituted or unsubstituted monovalent acyclic saturated hydrocarbon groups each having a carbon number of 6 to 15, and further, groups other than the cyclic or acyclic saturated hydrocarbon groups in all organic groups represented by $R^1$ to $R^4$ represent the same or different substituted or unsubstituted monovalent hydrocarbon groups each having a carbon number of 1 to 7

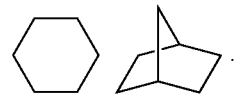

2. The temporary adhesive composition according to claim 1,
   wherein the antioxidant of the component (B) is at least one or more types of compositions selected from a group including a hindered phenol based compound, a hindered amine based compound, an organic phosphorous compound, and an organic sulfur compound.

3. The temporary adhesive composition according to claim 2,
   wherein the organopolysiloxane (A-2) is organopolysiloxane that is obtained by effecting a hydrosilylation reaction in the presence of a platinum group metal catalyst with respect to alkenyl group-containing organopolysiloxane (a1) that 2 to 10 mole % in all organic groups represented by $R^1$ to $R^4$ in the organopolysiloxane (A-1) represent alkenyl groups having a carbon number of 2 to 7 and one or more types of organohydrogenpolysiloxane (a2) that are represented by the following general formula (1) and has total SiH groups whose amount is 0.4 to 1.0-fold of total alkenyl groups in the alkenyl group-containing organopolysiloxane (a1), the organopolysiloxane having a weight average molecular weight of 30,000 to 200,000 and being insoluble in a polar solvent that has an SP value higher than 9,

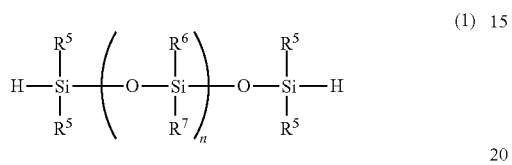

(1)

wherein $R^5$ to $R^7$ represent the same or different monovalent hydrocarbon groups each having a carbon number of 1 to 12 excluding an alkenyl group, and n represents an integer of 0 to 100.

4. The temporary adhesive composition according to claim 3, wherein the organic solvent of the component (C) is a hydrocarbon solvent that has a boiling point of 120 to 240° C. and an SP value which is 9 or lower.

5. A method for manufacturing a thin wafer by bonding a wafer having a circuit forming surface and a circuit non-forming surface to a support substrate and performing grinding, comprising:
a bonding step of forming an adhesion layer on at least one of the circuit forming surface and the support substrate surface by using the temporary adhesive composition according to claim 4, and bonding the circuit forming surface of the wafer to the support substrate through the adhesion layer;
a grinding step of grinding the circuit non-forming surface of the wafer bonded to the support substrate;
a delaminating step of delaminating the ground wafer from the support substrate; and
a removing step of removing the adhesion layer remaining on the circuit forming surface of the delaminated wafer.

6. The temporary adhesive composition according to claim 2, wherein the organic solvent of the component (C) is a hydrocarbon solvent that has a boiling point of 120 to 240° C. and an SP value which is 9 or lower.

7. The temporary adhesive composition according to claim 1, wherein the organopolysiloxane (A-2) is organopolysiloxane that is obtained by effecting a hydrosilylation reaction in the presence of a platinum group metal catalyst with respect to alkenyl group-containing organopolysiloxane (a1) that 2 to 10 mole % in all organic groups represented by $R^1$ to $R^4$ in the organopolysiloxane (A-1) represent alkenyl groups having a carbon number of 2 to 7 and one or more types of organohydrogenpolysiloxane (a2) that are represented by the following general formula (1) and has total SiH groups whose amount is 0.4 to 1.0-fold of total alkenyl groups in the alkenyl group-containing organopolysiloxane (a1), the organopolysiloxane having a weight average molecular weight of 30,000 to 200,000 and being insoluble in a polar solvent that has an SP value higher than 9,

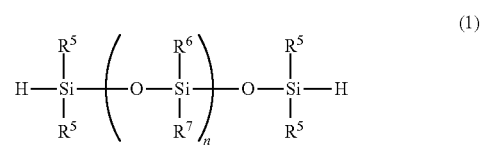

(1)

wherein $R^5$ to $R^7$ represent the same or different monovalent hydrocarbon groups each having a carbon number of 1 to 12 excluding an alkenyl group, and n represents an integer of 0 to 100.

8. The temporary adhesive composition according to claim 7, wherein the organic solvent of the component (C) is a hydrocarbon solvent that has a boiling point of 120 to 240° C. and an SP value which is 9 or lower.

9. The temporary adhesive composition according to claim 1, wherein the organic solvent of the component (C) is a hydrocarbon solvent that has a boiling point of 120 to 240° C. and an SP value which is 9 or lower.

10. A method for manufacturing a thin wafer by bonding a wafer having a circuit forming surface and a circuit non-forming surface to a support substrate and performing grinding, comprising:
a bonding step of forming an adhesion layer on at least one of the circuit forming surface and the support substrate surface by using the temporary adhesive composition according to claim 1, and bonding the circuit forming surface of the wafer to the support substrate through the adhesion layer;
a grinding step of grinding the circuit non-forming surface of the wafer bonded to the support substrate;
a delaminating step of delaminating the ground wafer from the support substrate; and
a removing step of removing the adhesion layer remaining on the circuit forming surface of the delaminated wafer.

* * * * *